United States Patent
Maekawa

(10) Patent No.: US 6,171,957 B1
(45) Date of Patent: Jan. 9, 2001

(54) MANUFACTURING METHOD OF SEMICONDUCTOR DEVICE HAVING HIGH PRESSURE REFLOW PROCESS

(75) Inventor: Kazuyoshi Maekawa, Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/009,176

(22) Filed: Jan. 20, 1998

(30) Foreign Application Priority Data

Jul. 16, 1997 (JP) .................................................. 9-191065

(51) Int. Cl.[7] .................................................. H01L 21/44
(52) U.S. Cl. .......................................... 438/672; 438/687
(58) Field of Search .................................... 438/632, 646, 438/643, 660, 672, 688, 653, 663, 675, 680, 687, 424, 430, 584; 427/375, 383, 123, 124, 376.7, 397.7

(56) References Cited

U.S. PATENT DOCUMENTS

| 5,011,793 | * | 4/1991 | Obinata .................................. 437/203 |
| 5,447,599 | | 9/1995 | Li et al. . |
| 5,470,789 | | 11/1995 | Misawa . |

(List continued on next page.)

FOREIGN PATENT DOCUMENTS

| 196 14 331 A1 | 4/1997 | (DE) . |
| 2-205678 | 8/1990 | (JP) . |
| 6-275612 | 9/1994 | (JP) . |
| 7-503106 | 3/1995 | (JP) . |
| 7-94507 | 4/1995 | (JP) . |
| 8-172131 | 6/1996 | (JP) . |
| 408203895A | * 8/1996 | (JP) . |
| 408241923A | * 9/1996 | (JP) . |
| 408293552A | * 11/1996 | (JP) . |
| 409219449 | * 8/1997 | (JP) . |
| 410125782A | * 5/1998 | (JP) . |
| 410125783A | * 5/1998 | (JP) . |
| 410172972A | * 6/1998 | (JP) . |
| 410242268A | * 9/1998 | (JP) . |
| 410256372A | * 9/1998 | (JP) . |
| WO 94/13008 | 6/1994 | (WO) . |

OTHER PUBLICATIONS

B. Vollmer, T. Licata, D. Restaino, and J. Ryan; "Recent advances in the application of collimated sputtering." Thin Solid Films, vol. 247 (1994) p. 105, 1994.*

Stanley Wolf and Richard N. Tauber, Silicon Processing for the VLSI Era. Lattice Press. p. 191, 1986.*

"A Novel High Pressure Low Temperature Aluminum Plug Technology For Sub–0.5 μm Contact/Via Geometries" by G.A. Dixit et al. IEEE IEDM Technical Digest, 1994, pp. 105–108.

GUTMANN; R.J. (u.a.) Integration of Copper multilevel interconnects with oxide und polymer interlevel dielectrics –In: Thin Solid Films 270, 1995, 472–479.

* cited by examiner

Primary Examiner—Matthew Smith
Assistant Examiner—Robert A Hullinger
(74) Attorney, Agent, or Firm—McDermott, Will & Emery

(57) ABSTRACT

After a copper film is formed so as to cover a wiring connection hole in an interlayer insulating film of a semiconductor device, an oxidation preventive film for preventing oxidation of copper is formed on the copper film while maintaining a high vacuum atmosphere of $1.33 \times 10^{-3}$ Pa or less, and copper of the copper film is pressure-introduced into a void of the wiring connection hole by using a high-temperature, high-pressure inert gas. The oxidation preventive film is a silicon nitride film or a metal film such as a titanium film. The copper film is formed by sputtering by using, as a target, copper having purity of 99.999 wt % (5N) or higher. The amount of impurity gases contained in the high-pressure inert gas is set at 50 vpm or less.

5 Claims, 2 Drawing Sheets

U.S. PATENT DOCUMENTS

| | | | |
|---|---|---|---|
| 5,534,463 | * 7/1996 | Lee et al. | 437/195 |
| 5,572,071 | * 11/1996 | Lee | 257/751 |
| 5,602,053 | 2/1997 | Zheng, et al. | 437/60 |
| 5,635,423 | 6/1997 | Huang, et al. | 437/195 |
| 5,654,232 | * 8/1997 | Gardener | 438/661 |
| 5,864,179 | * 1/1999 | Koyama | 257/767 |
| 5,877,086 | * 3/1999 | Aruga | 438/653 |
| 5,877,087 | * 3/1999 | Mosely et al. | 438/656 |
| 5,880,023 | * 3/1999 | Jun | 438/652 |
| 5,891,803 | * 4/1999 | Gardner | 438/660 |
| 5,891,804 | * 4/1999 | Havemann et al. | 438/674 |
| 5,897,370 | * 4/1999 | Joshi et al. | 438/632 |
| 5,913,146 | * 6/1999 | Merchant et al. | 438/646 |
| 5,915,421 | * 6/1999 | Borzym et al. | 138/142 |
| 5,932,289 | * 8/1999 | Dobson et al. | 427/383 |

MANUFACTURING METHOD OF SEMICONDUCTOR DEVICE HAVING HIGH PRESSURE REFLOW PROCESS

BACKGROUND OF THE INVENTION

1. Field of the Invention

The present invention relates to a manufacturing method of a semiconductor device and a semiconductor device manufactured thereby and, more specifically, to improvement of a high-pressure reflow process for formation of interconnections of a semiconductor device.

2. Background Art

A conventional manufacturing method of a semiconductor device and the structure of a resulting semiconductor device will be described with reference to FIGS. 3(a)–3(c).

FIG. 3(a) illustrates the formation in a semiconductor wafer 10, of an interlayer insulating film 2 on a semiconductor substrate 1 (silicon substrate) on which a semiconductor element (not shown) is formed. Subsequently, a wiring groove 3 and a connection hole 3a are formed capable of electrically connecting the semiconductor element on the semiconductor substrate 1 to an upper-layer interconnection (not shown) formed on the interlayer insulating film 2.

Then, the semiconductor wafer 10 (under manufacture) is placed in a low-pressure atmosphere to remove water, etc. absorbed on the surface, and the temperature is increased. If necessary, the surface of the wafer 10 is thereafter cleaned by etching it by argon inverse sputtering.

Then, a copper film 5 is formed by sputtering. At this time, as shown in FIG. 3(b), a void 8 is formed at the bottom of the connection hole 3a in the wiring groove 3 of the semiconductor wafer 10.

Subsequently, while the semiconductor wafer 10 is heated to 400° C. or higher, a high pressure of about 40–100 MPa is applied. The copper is caused to flow into the void 8, and the inside of the wiring groove 3 and the connection hole 3a is charged with copper.

As shown in FIG. 3(c), the copper film 5 is oxidized (by oxygen or water included in an argon gas) for the application of a high pressure, forming copper oxide film 7 on the surface of the copper film 5. The oxidation of the copper film S is not limited to its surface, and oxygen diffuses into the inside of the copper film 5. Thus, the flowability of copper during the application of a high pressure is lowered. As a result, as shown in FIG. 3(c), the void 8 remains even after the high-pressure treatment. That is, filling failure occurs.

SUMMARY OF THE INVENTION

The present invention has been made to solve the above problem in the art. An object of the invention is therefore to provide a manufacturing method of a semiconductor device which can prevent oxidation of copper and resulting deterioration of the filling characteristic in a copper high-pressure reflow process of the kind as described above, which is used in wiring of a semiconductor device such as a DRAM or a logic device or in forming an interconnection with the formation of a contact hole or a through-hole, as well as to provide a semiconductor device manufactured by such a method.

According to one aspect of the present invention, in a manufacturing method of a semiconductor device, a wiring groove and/or a connection hole is formed in an interlayer insulating film of a semiconductor wafer. A copper film is formed on the interlayer insulating film so as to cover the wiring groove and/or the connection hole. Then, copper of the copper film is pressure-introduced into the wiring groove and/or into the connection hole by using a high-pressure and high-temperature inert gas. Further, part of the copper film is removed by chemical mechanical polishing, thereby leaving copper only in the wiring groove and/or in the connection hole.

Other and further objects, features and advantages of the invention will appear more fully from the following description.

BEST MODE OF CARRYING OUT THE INVENTION

This invention will be described in further detail by way of examples with reference to the accompanying drawings.

First Embodiment

A manufacturing method of a semiconductor device and the structure of a resulting semiconductor device according to a first embodiment of the present invention will be described below with reference to FIGS. 1(a)–1(f).

Figure 1A:
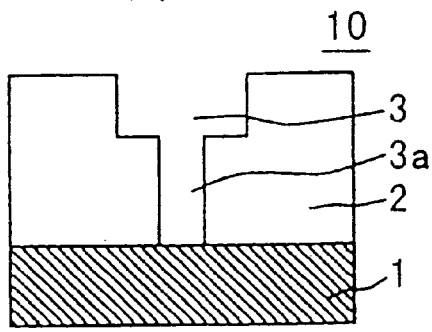
FIGS. 1(a)–1(f) show steps of a manufacturing method according to first, second, third and fourth embodiments of the present invention, and the structure of a resulting semiconductor device.

FIG. 1(a) shows a sectional view of a semiconductor wafer 10. In FIG. 1(a), after formation of an interlayer insulating film 2 on a semiconductor substrate 1 (silicon substrate) on which a semiconductor element (not shown) is formed, a wiring groove 3 is formed in the interlayer insulating film 2. Further, a connection hole 3a is formed capable of electrically connecting the semiconductor element on the semiconductor substrate 1 to an interconnection to be formed in the wiring groove 3 or to an upper-layer interconnection (not shown) to be formed on the interlayer insulating film 2.

Figure 1D:
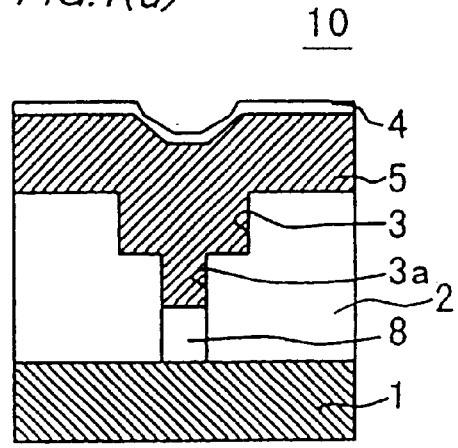
Figure 1B:
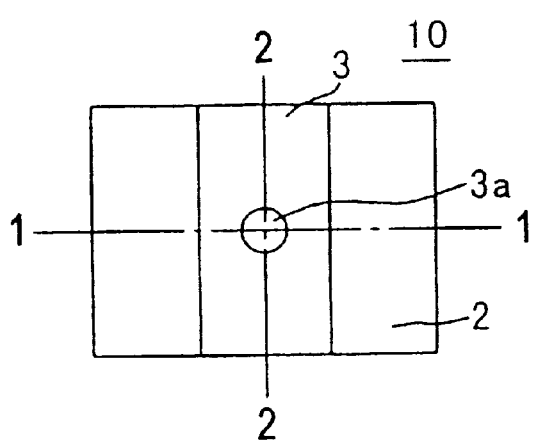
Figure 1E:
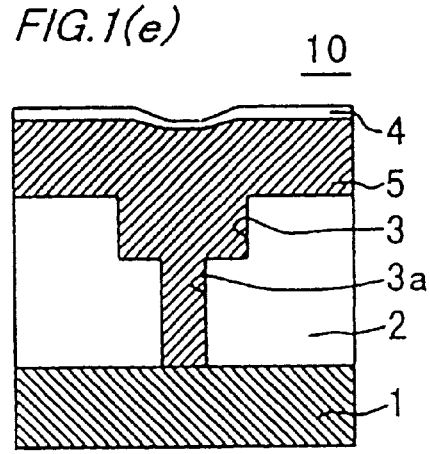
Figure 1C:
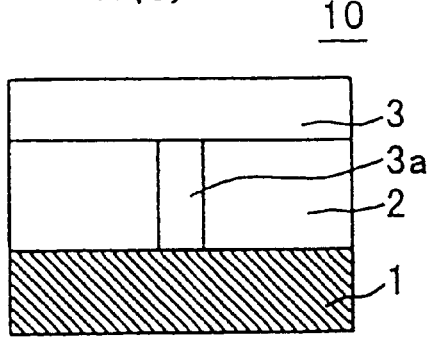

FIG. 1(b) is a plan view of the semiconductor wafer 10 shown in FIG. 1(a). FIG. 1(a) is a I–I' cross-section of FIG. 1(b). FIG. 1(c) shows a II–II' cross-section of FIG. 1(b).

To remove water etc. absorbed on the surface, the semiconductor wafer 10 (under manufacture) is placed in a low-pressure atmosphere, and the temperature is increased. The temperature may be increased by either lamp heating or a gas heating method. The semiconductor wafer 10 is heated by increasing the temperature of a platen that holds the semiconductor wafer 10 in a processing chamber, and by introducing an inert gas into the chamber to provide a pressure of about 10–1,000 Pa. If necessary, the surface of the wafer 10 is thereafter cleaned by etching with argon inverse sputtering or inverse sputtering in a mixed gas obtained by adding hydrogen ($H_2$) to argon.

As shown in FIG. 1(d), a copper film 5 is formed by sputtering or CVD on the interlayer insulating film 2, including its portion where the wiring groove 3 and the connection hole 3a are formed, at a sufficient thickness to cover the wiring groove 3 and the connection hole 3a.

During the period after the step of forming the copper film 5 up to the start of the next step of forming an oxidation preventive film (described later) for the copper film 5, the processing chamber is continuously kept in a high vacuum of $1.33 \times 10^{-3}$ Pa ($1 \times 10^{-5}$ Torr) or less so that the semiconductor wafer 10 is not exposed to the air. This is to prevent the copper film 5 from being oxidized. Preferably, the semiconductor wafer is kept in a high vacuum of $1.33 \times 10^{-3}$ Pa ($1 \times 10^{-5}$ Torr) or less, until before the beginning of the next step of forming an oxidation preventive film.

Then, an oxidation preventive film 4 is formed on the copper film 5, while the semiconductor wafer 10 is continuously kept in a vacuum without being exposed to the air. This prevents the copper film 5 from being oxidized by impurities (oxygen, etc.) contained in an argon gas or the like that is applied in a high-temperature, high-pressure condition in a step described later. During the step of forming the oxidation preventive film, the atmosphere may be around $1.33 \times 10^{-2}$ Pa ($1 \times 10^{-4}$ Torr) It is appropriate that the oxidation preventive film 4 be a titanium nitride (TiN) film of about 200 nm in thickness. At this time, as shown in FIG. 1(d), a void 8 is formed at the bottom of the connection hole 3a in the wiring groove 3 of the semiconductor wafer 10. Preferably, the semiconductor wafer is kept in a high vacuum of $1.33 \times 10^{-3}$ Pa ($1 \times 10^{-5}$ Torr) or less, after forming an oxidation preventive film to the next step.

Subsequently, while the semiconductor wafer 10 is heated to 400° C. or higher in a high-temperature and high-pressure processing chamber, an inert gas, such as argon, is caused to flow into the chamber to provide a high pressure of about 40–100 MPa. As a result, copper of the copper film 5 is pressure-introduced into the void 8 and rendered flowable. Hence, the inside of the wiring groove 3 and the connection hole 3a is charged with copper, as shown in FIG. 1(e).

As described above, to prevent oxidation of copper, the series of steps described so far are performed in a high vacuum (of $1.33 \times 10^{-3}$ Pa ($1 \times 10^{-5}$ Torr) or less) without exposing the semiconductor wafer 10 to the air.

During the period after forming the copper film 5 up to the start of the next step of forming an oxidation preventive film, the processing chamber is continuously kept in a high vacuum of $1.33 \times 10^{-3}$ Pa ($1 \times 10^{-5}$ Torr) or less. Further, the processing chamber is preferably kept in a high vacuum of $1.33 \times 10^{-3}$ Pa ($1 \times 10^{-5}$ Torr) or less after forming an oxidation preventive film to the next step. During the step of forming the oxidation preventive film, it is permissible that the processing chamber comes to be in a high vacuum of around $1.33 \times 10^{-2}$ Pa ($1 \times 10^{-4}$ Torr).

When the semiconductor wafer 10 is processed in a processing chamber of $1.33 \times 10^{-2}$ Pa ($1 \times 10^{-4}$ Torr) after formation of the copper film 5, the copper becomes oxidized and the copper filling characteristic under a high pressure deteriorates. While slight oxidation of copper occurs at $6.65 \times 10^{-3}$ Pa ($5 \times 10^{-5}$ Torr), it was possible to prevent copper oxidation at $1.33 \times 10^{-3}$ Pa ($1 \times 10^{-5}$ Torr) or less.

While a 200-nm-thick titanium nitride (TiN) film is used as the oxidation preventive film 4 in the above process, the titanium nitride film provides the oxidation preventing effect as long as its thickness is 50 nm or more.

Examples of the copper oxidation preventive film 4 are titanium (Ti), tantalum (Ta), tungsten (W), molybdenum (Mo), manganese (Mn), and the like, and oxides, nitrides, and silicides thereof. Further, a composite film of the above materials such as a TiN/Ti film may also be used. The metal of the oxidation preventive film 4 is oxidized, thereby preventing oxidation of the copper film 5 located thereunder. One or more elements such as Al, Ti, and Si may be introduced in copper at about 0.1–10 wt % as a result of the high-temperature, high-pressure treatment.

Figure 1F:
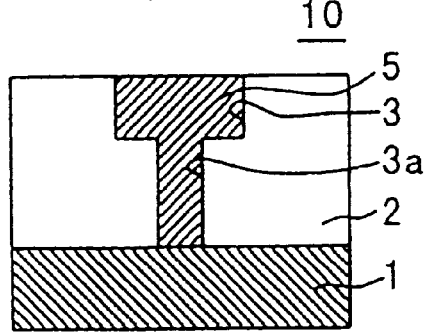

Subsequently, as shown in FIG. 1(f), the oxidation preventive film 4, and an unnecessary part of the copper film 5, are removed by chemical mechanical polishing (CMP). CMP removes the preventive film 4 and the unnecessary part of the copper film 5 from the semiconductor wafer 10, in which the wiring groove 3 and the connection hole 3a are filled with copper. Thus, the copper film 5 is left only in the wiring groove 3 and in the connection hole 3a, and an interconnection in the wiring groove 3 and the connection hole 3a is completed. Thereafter, manufacturing steps of a semiconductor device that are common in the art are performed to complete a semiconductor device.

As described above, in the first embodiment, the copper film 5 for wiring and a titanium film or the like are formed as the oxidation preventive film 4 for the copper film 5 is formed thereon while a high vacuum atmosphere is continuously maintained. Copper of the copper film 5 is pressure-introduced into the wiring groove 3 and/or the connection hole 3a, and particularly in to the void 8, by using a high-temperature, high-pressure inert gas. Therefore, oxidation of the copper film 5 and resulting deterioration of the filling characteristic can be prevented.

Second Embodiment

A manufacturing method of a semiconductor device according to a second embodiment of the present invention will be described with reference to FIGS. 1(a)–1(f) and FIG. 2.

First, a step of forming a wiring groove 3, and/or a connection hole 3a of a semiconductor wafer 10, shown in FIG. 1(a), and a subsequent step of cleaning the surface of the semiconductor wafer 10 are performed in the same manner as in the first embodiment. For simplification, redundant descriptions are omitted.

Figure 2:
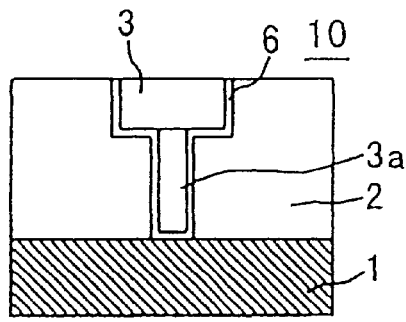
FIG. 2 shows a step of the manufacturing method according to the second embodiment of the invention.
Figure 3A:
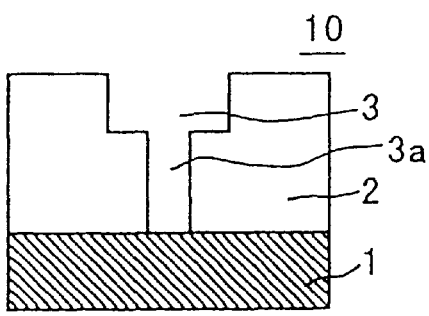
FIGS. 3(a)–3(c) show steps of a conventional manufacturing method of a semiconductor device and the structure of a resulting semiconductor device
Figure 3B:
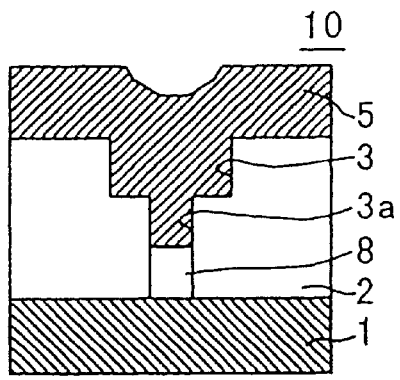
Figure 3C:
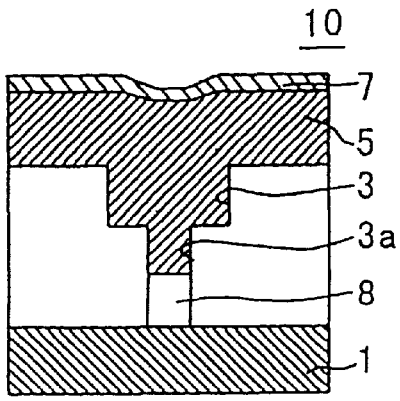

Then, as shown in FIG. 2, a barrier layer 6 to serve as a wetting layer for copper filling is formed on the surfaces of the wiring groove 3, and of the connection hole 3a by using a TiN/Ti film (70/30 nm).

Then, in the same manner as in the first embodiment, a copper film 5 is formed by sputtering or CVD on an interlayer insulating film 2, including the portion where the wiring groove 3 and the connection hole 3a are formed and covered with the barrier layer 6, at a sufficient thickness to cover the wiring groove 3 and the connection hole 3a.

Subsequently, an oxidation preventive film 4 for preventing oxidation of copper is formed on the copper film 5. In the second embodiment, a silicon nitride film as the oxidation preventive film 4 is formed by CVD. Since the silicon nitride film prevents oxidation of copper, the copper filling characteristic can be prevented from being deteriorated even if a high pressure is applied.

At this time, as shown in FIG. 1(d), a void 8 is formed at the bottom of the connection hole 3a of the wiring groove 3.

Then, a step of pressure-introducing copper into the void 8 by using a high-temperature, high-pressure inert gas and a step of forming an interconnection by chemical mechanical polishing (CMP) are performed. The steps are the same as those described with respect to the first embodiment.

In the second embodiment, as in the case of the first embodiment, to prevent oxidation of the copper film 5, the inside of a processing chamber is continuously kept at a high vacuum pressure of $1.33 \times 10^{-3}$ Pa ($1 \times 10^{-5}$ Torr) or less without exposing the semiconductor wafer 10 to the air after forming the copper film 5 up to the beginning of forming the oxidation preventive film 4. Further, the semiconductor wafer in preferably kept in a high vacuum of $1.33 \times 10^{-3}$ Pa ($1 \times 10^{-5}$ Torr) or less after forming an oxidation preventive film to the next step.

Subsequently, steps of removing an unnecessary part of the copper film 5 and forming an interconnection are performed. The steps are the same as those described with respect to the first embodiment.

The formation of the barrier layer 6 on the surfaces of the wiring groove 3 and the connection hole 3a may also be applied to the first embodiment. Although the barrier layer 6 is effective in facilitating the copper filling, it may be omitted.

As described above, in the second embodiment, the copper film 5 for wiring and a silicon nitride film as the oxidation preventive film 4 for the copper film 5 are formed thereon, while a high vacuum atmosphere is continuously maintained. Copper of the copper film 5 is pressure-introduced into the wiring groove 3 and/or the connection hole 3a, and particularly in to the void 8, by using a high-temperature, high-pressure inert gas. Therefore, oxidation of the copper film 5 and resulting deterioration of the filling characteristic can be prevented.

Third Embodiment

A manufacturing method of a semiconductor device according to a third embodiment of the present invention will be described with reference to FIGS. 1(a)–1(f).

First, steps from formation of a wiring groove 3 and/or a connection hole 3a of a semiconductor wafer 10, shown in FIG. 1(a), to formation of a copper film 5 and an oxidation preventive film 4, shown in FIG. 1(d), are performed in the same manner as in the first embodiment.

For simplicity, redundant descriptions therefor are omitted.

Then, while the semiconductor wafer 10 is heated to 400° C. or higher, a high pressure of about 40–100 MPa is applied by using an inert gas such as argon. Hence, the copper is rendered flowable and introduced into the void 8, charging the inside of connection hole 3a in the wiring groove 3 with copper, as shown in FIG. 1(e).

In the third embodiment, to prevent oxidation of copper, the amount of impurity gases contained in the inert gas that is applied in the above step is controlled so as to be 50 vpm (volumetric parts per million) or less. Examples of impurity gases contained in the inert gas are oxygen and water. The amount of such impurity gases should be minimized because they may oxidize copper in a high-temperature, high-pressure atmosphere.

When the density of impurity gases in a high-pressure inert gas (argon) is about 100 vpm, copper becomes oxidized and the copper filling characteristic deteriorates resultingly. On the other hand, when the density of impurity gases is 50 vpm or less, almost no oxidation of copper occurs. In particular, when the density of impurity gases is 10 vpm or less, neither copper oxidation nor resulting deterioration of the filling characteristic occurs.

In the third embodiment, as in the case of the first embodiment, to prevent oxidation of the copper film 5, the inside of a processing chamber is continuously kept at a high vacuum pressure of $1.33 \times 10^{-3}$ Pa ($1 \times 10^{-5}$ Torr) or less. The semiconductor wafer 10 is not exposed to the air after the step of forming the copper film 5 up to the beginning of the next step of forming the oxidation preventive film 4 for the copper film 5. Further, the processing chamber is preferably kept at a high vacuum pressure of $1.33 \times 10^{-3}$ Pa ($1 \times 10^{-5}$ Torr) or less, after forming an oxidation preventive film to the next step.

Subsequently, steps of removing an unnecessary part of the copper film 5 and forming an interconnection are performed. Since these steps are the same as in the first embodiment, redundant descriptions therefor are omitted for simplicity.

As described above, in the third embodiment, the copper film 5 for wiring and the oxidation preventive film 4 are formed thereon while a high vacuum atmosphere is continuously maintained, and copper of the copper film 5 is pressure-introduced into the wiring groove 3 and/or the connection hole 3a, particularly in to the void 8, by using a high-temperature, high-pressure inert gas in which the amount of impurities is controlled. Therefore, oxidation of the copper film 5 and resulting deterioration of the filling characteristic can be prevented.

Fourth Embodiment

A manufacturing method of a semiconductor device according to a fourth embodiment of the invention will be described with reference to FIGS. 1(a)–1(f).

First, a step of forming a wiring groove 3 and/or a connection hole 3a of a semiconductor wafer 10, shown in FIG. 1(a), and a subsequent step of cleaning the surface of the semiconductor wafer 10 are performed in the same manner as in the first embodiment. For simplification, redundant descriptions are omitted.

Then, as shown in FIG. 1(d), a copper film 5 is formed on an interlayer insulating film 2 by sputtering or CVD at a sufficient thickness to cover the wiring groove 3 and the connection hole 3a.

In the fourth embodiment, a copper target having a purity of 99.999 wt % (5N) or higher is used in forming the copper film 5 by sputtering. By using a highly pure copper target, the amount of impurities contained in the copper film 5 formed by sputtering is reduced, preventing deterioration of the filling characteristic due to, for example, copper oxidation during application of a high pressure.

The filling characteristic after the formation of the copper film 5 is deteriorated when the copper purity is 99.995 wt % (4N5), and is not deteriorated when the copper purity is 99.999 wt % (5N).

Then, a step of forming an oxidation preventive film 4 is performed. This step is the same as disclosed in the first and second embodiments. Hence, descriptions therefor are omitted.

Subsequently, a step of pressure-introducing copper into the void 8 of the wiring groove 3 and/or connection hole 3a in a high-temperature, high-pressure atmosphere of an inert gas is performed. This step is the same as disclosed in the first and third embodiments. Hence, descriptions therefor are omitted.

In the fourth embodiment, as in the case of the first embodiment, to prevent oxidation of the copper film 5, the inside of a processing chamber is continuously kept at a high vacuum pressure of $1.33 \times 10^{-3}$ Pa ($1 \times 10^{-5}$ Torr) or less without exposing the semiconductor wafer 10 to the air after the step of forming the copper film 5 up to the beginning of the next step of forming the oxidation preventive film 4. Further, the processing chamber is preferably kept at a high vacuum pressure of $1.33 \times 10^{-3}$ Pa ($1 \times 10^{-5}$ Torr) or less after forming an oxidation preventive film to the next step.

Subsequently, steps of removing an unnecessary part of the copper film 5 and forming an interconnection are performed. These steps are the same as those disclosed in the first embodiment, and the descriptions therefore are omitted.

As described above, in the fourth embodiment, the copper film 5 for wiring is formed by using high purity copper, and the oxidation preventive film 4 for the copper film 5 is formed thereon while a high vacuum atmosphere is continuously maintained, and copper of the copper film 5 is pressure-introduced into the wiring groove 3 and/or the connection hole 3a, and particularly in to the void 8, by using a high-temperature, high-pressure inert gas. Therefore, oxidation of the copper film 5 and resulting deterioration of the filling characteristic can be prevented.

The first to fourth embodiments are directed to the wiring structure in which, as shown in the sectional view of FIG. 1(a), the wiring groove 3 communicates with the semiconductor substrate 1 via the connection hole 3a. However, in the invention, the wiring structure is not limited to such a structure. For example, the invention is applicable to a case where only the wiring groove 3 is formed in the interlayer insulating film 2, as well as to a case where only the connection hole 3a is formed so as to connect an interconnection or a conductive portion located in a laver above the interlayer insulating film 2 to the semiconductor substrate 1. Thus, the invention encompasses the case where an interconnection is formed by filling a void of either the wiring groove 3 or the connection hole 3a with copper rather than both of them.

Next, the effects and advantages of the present invention are summarized as follows.

As described above, according to the present invention, after a wiring groove and/or a connection hole is formed in an interlayer insulating film of a semiconductor wafer, a copper film is formed on the surfaces of the wiring groove and/or the connection hole. Then, the semiconductor wafer in kept in a high vacuum atmosphere of $1.33 \times 10^{-3}$ Pa ($1 \times 10^{-5}$ Torr) or less until up to the next step of forming an oxidation preventive film. After forming an oxidation preventive film, the copper of the copper film is pressure-introduced into the wiring groove and/or the connection hole, and particularly in to a void, by using a high-temperature, high-pressure inert gas. Therefore, oxidation of the copper film and resulting deterioration of the filling characteristic can be prevented, whereby an interconnection having superior characteristics can be formed.

According to the present invention, oxidation of the copper film and resulting deterioration of the filling characteristic can be prevented. As a result, an interconnection having superior characteristics can be formed by using, as the material of the oxidation preventive film for the copper film, titanium, tantalum, tungsten, molybdenum, or manganese, or an oxide, nitride, or a silicide thereof, or a composite thereof.

According to the present invention, oxidation of the copper film and resulting deterioration of the filling characteristic can be prevented. As a result, an interconnection having superior characteristics can be formed by using a silicon nitride film as the oxidation preventive film for the copper film.

According to the present invention, the copper film is formed by using, as a target, copper having purity of 99.999 wt % (5N) or higher, and thus a copper film of high purity can be formed. Therefore, oxidation of the copper film and resulting deterioration of the filling characteristic can be prevented, whereby an interconnection having superior characteristics can be formed.

Further, according to the present invention, the amount of impurity gases contained in an inert gas used in the step of pressure-introducing copper into a void of the wiring groove or the connection hole is set at 50 vpm or less. Therefore, oxidation of the copper film and resulting deterioration of the filling characteristic can be prevented, whereby an interconnection having superior characteristics can be formed.

Obviously many modifications and variations of the present invention are possible in the light of the above teachings. It is therefore to be understood that within the scope of the appended claims the invention may by practiced otherwise than as specifically described.

What is claimed is:

1. A manufacturing method of a semiconductor device comprising the steps of:

forming a wiring groove and/or a connection hole in an interlayer insulating film of a semiconductor wafer;

forming a copper film on said interlayer insulating film so as to cover said wiring groove and/or said connection hole;

maintaining the semiconductor wafer at a pressure of $1.33 \times 10^{-3}$ Pa or less continuously after the copper film forming step and until the start of the step of pressure-introducing of the copper of said copper film into said wiring groove and/or connection hole;

forming an oxidation preventive film for preventing oxidation of copper on said copper film in a high vacuum atmosphere;

pressure-introducing copper of said copper film into said wiring groove and/or into said connection hole by a high-pressure and high-temperature inert gas; and removing part of said copper of said copper film by chemical mechanical polishing, thereby leaving copper only in said wiring groove and/or in said connection hole.

2. The manufacturing method according to claim 1, wherein said oxidation preventive film is comprised of titanium, tantalum, tungsten, molybdenum, or manganese, or an oxide, nitride, or a silicide thereof, or a composite thereof.

3. The manufacturing method according to claim 1, wherein said oxidation preventive film is a silicon nitride film.

4. The manufacturing method according to claim 1, wherein said copper film is formed by sputtering which uses copper, as a target, having purity of 99.999 wt % or higher.

5. The manufacturing method according to claim 1, wherein an amount of impurity gases contained in said inert gas that is used in the copper pressure-introducing step is set at 50 vpm or less.

* * * * *